United States Patent
Miura (10) Patent No.: US 7,150,898 B2
(45) Date of Patent: Dec. 19, 2006

(54) DROPLET APPLYING METHOD AND DROPLET APPLYING DEVICE, AND DEVICE AND ELECTRONIC EQUIPMENT

(75) Inventor: Hirotsuna Miura, Fujimi-machi (JP)

(73) Assignee: Seiko Epson Corporation, Tokyo (JP)

( * ) Notice: Subject to any disclaimer, the term of this patent is extended or adjusted under 35 U.S.C. 154(b) by 97 days.

(21) Appl. No.: 10/959,194

(22) Filed: Oct. 7, 2004

(65) Prior Publication Data

US 2005/0104912 A1 May 19, 2005

(30) Foreign Application Priority Data

Oct. 29, 2003 (JP) .............................. 2003-369061

(51) Int. Cl.
*B05D 1/02* (2006.01)
(52) U.S. Cl. ................. 427/421.1; 427/424; 427/427.3
(58) Field of Classification Search ............. 427/421.1, 427/424, 427.3
See application file for complete search history.

(56) References Cited

U.S. PATENT DOCUMENTS

| 4,403,223 | A | * | 9/1983 | Tsuzuki et al. ............... 347/68 |
| 6,467,894 | B1 | | 10/2002 | Misumi |
| 2003/0184613 | A1 | | 10/2003 | Nakamura et al. |
| 2003/0202054 | A1 | * | 10/2003 | Jeanmaire et al. ............ 347/77 |

FOREIGN PATENT DOCUMENTS

| JP | A 09-073013 | | 3/1997 |
| JP | A 10-226075 | | 8/1998 |
| JP | A 10-263467 | | 10/1998 |
| JP | A-11-248925 | | 9/1999 |
| JP | A-11-274671 | | 10/1999 |
| JP | A 2000-094668 | | 4/2000 |
| JP | A 2000-211117 | | 8/2000 |
| JP | A 2000-260319 | | 9/2000 |
| JP | 2002139615 | * | 5/2002 |
| JP | A 2003-262714 | | 9/2003 |
| JP | A 2003-266669 | | 9/2003 |
| JP | A 2004-037855 | | 2/2004 |
| KR | A-2003-0065347 | | 8/2003 |

* cited by examiner

*Primary Examiner*—Alain L. Bashore
(74) *Attorney, Agent, or Firm*—Oliff & Berridge, PLC (57) ABSTRACT

Exemplary embodiments enable formation of a uniform film and a pattern with a minute line width and generate no or substantially no quality defects, such as disconnection. A droplet is discharged from a droplet discharging head to apply in a predetermined region on a surface of a substrate while relatively moving the droplet discharging head and the substrate. The droplet is discharged with respect to the surface of the substrate in a direction intersecting with a vertical direction, and when relatively moving the droplet discharging head and the substrate to discharge the droplet, the droplet is discharged along the relative movement direction.

4 Claims, 9 Drawing Sheets

DROPLET APPLYING METHOD AND DROPLET APPLYING DEVICE, AND DEVICE AND ELECTRONIC EQUIPMENT

BACKGROUND OF THE INVENTION

1. Field of Invention

Exemplary embodiments of the present invention relate to a droplet applying method, a droplet applying device, a device and electronic equipment.

2. Description of Related Art

Usage of liquid crystal display devices, such as color liquid crystal display devices, has increased with the development of electronic equipment, such as computers and portable information equipment terminals. In this type of liquid crystal display device, a color filter is used to colorize a display image. In some color filters, a substrate is provided and inks (droplets) of R (red), G (green) and B (blue) are landed on this substrate in a predetermined pattern, and these inks are dried on the substrate, thereby forming a coloring layer. As a method for landing the inks on, and applying to, the substrate, for example, a drawing machine by an ink-jet method (droplet discharging method) is employed.

In the case where the ink-jet method is employed, in the drawing machine, a predetermined amount of ink is discharged from an ink-jet head and is landed on a filter. In this case, for example, the substrate is mounted on a Y stage (a stage movable in a Y direction), and the ink-jet head is mounted on an X stage (a stage movable in an X direction). After the ink-jet head is positioned in a predetermined position by driving the X stage, the ink is discharged while moving the substrate relatively to the ink-jet head by driving the Y stage, thereby enabling the ink from a plurality of ink-jet heads to be landed at predetermined positions of the substrate. A related art technique for manufacturing a color filter by such an ink-jet method is disclosed in Japanese Unexamined Patent Publication No. H11-248925, for example.

Furthermore, Japanese Unexamined Patent Publication No. H11-274671 discloses a method using a droplet discharging method as a manufacturing method of a fine wiring pattern, such as a semiconductor integrated circuit. The disclosed technique includes discharging a functional liquid containing a material to form a pattern on a substrate from a droplet discharging head, the material being arranged (applied) on a pattern forming surface to form a wiring pattern. This method is considered to be very effective since it is capable of dealing with diversified small-quantity production and the like.

SUMMARY OF THE INVENTION

However, such a related art technique as described above has the following problem.

When dot-like droplet is applied two-dimensionally, each dot is independent, and thus in some wet spreading extent of the droplet, a uniform film may not be formed, which makes the film profile irregular. In this case, there is a possibility of exerting adverse effects on properties of a formed element.

Furthermore, in the case where wiring, such as metal wiring, is formed by droplet discharging, the droplet applied linearly is spread wet and a line width becomes large, thereby making it difficult to obtain wiring with a minute line width.

Furthermore, in the case where forming wiring, when a dot interval is narrowed to secure continuity, a phenomenon that the droplets are aggregated to be large, so that peripheral lines become thin, a so-called bulge occurs, which may cause disconnection.

An exemplary embodiment of the present invention addresses or achieves the above-mentioned points, and provides a droplet discharging method and a droplet discharging device which can form a uniform film and a pattern of a minute line width, and which causes no or substantially no quality defects, such as disconnection, and a device and electronic equipment.

In order to address or achieve the above, an exemplary embodiment of the present invention employs the following structure.

A droplet applying method of an exemplary embodiment of the present invention includes discharging a droplet from a droplet discharging head to apply in a predetermined region on a substrate surface, while relatively moving the droplet discharging head and the substrate. The droplet is discharged to the substrate surface in a direction intersecting a vertical direction, and when the droplet discharging head and the substrate are relatively moved to discharge the droplet, the droplet is discharged along the relative movement direction.

Accordingly, in an exemplary embodiment of the present invention, the discharged droplet has a velocity component in the direction along the substrate surface. As a result, the each droplet landing on the substrate surface does not spread in a dot shape, but spreads linearly with an elongated trail in the relative movement direction by its kinetic momentum, so that a substantially uniform film with less irregularity can be applied and formed. In this case, since the droplet is formed linearly, quality defects, such as disconnection, can be reduced or prevented from occurring.

Furthermore, in an exemplary embodiment of the present invention, since the droplet having a constant volume spreads linearly, the width of the line formed of this droplet becomes small, so that a pattern with a minute line width can be formed.

Furthermore, in an exemplary embodiment, it is preferable that the predetermined region of the substrate surface to which the droplet is to be applied is lyophilic with respect to the droplet. In this case, the linear pattern can be formed without slipping the droplet landing on the substrate surface.

Furthermore, it is preferable that, when the droplet is discharged with a weight of the droplet defined as W [ng], an initial velocity of the discharged droplet defined as v [m/s], a distance between a discharging part of the droplet discharging head that discharges the droplet and the substrate defined as d [mm], and an angle with respect to the substrate surface defined as θ, the following condition is satisfied.

$$40 < (v \cdot W \cdot \sin\theta)/d < 270$$

If $(v \cdot W \cdot \sin\theta)/d$ is 40 or less, the discharged droplet may curve during flight, thereby deteriorating a landing position precision. On the other hand, if $(v \cdot W \cdot \sin\theta)/d$ is 270 or more, the droplet landing on the substrate spatters, which may cause problems with an applying position precision and an application amount of the droplet. In an exemplary embodiment of the present invention, however, the droplet can be applied to the substrate with a high position precision in a predetermined application amount.

Furthermore, in an exemplary embodiment of the present invention, a structure is also preferable in which the droplet is discharged to a groove part formed in the substrate.

In this case, since the droplet landing on the substrate spreads linearly, thereby reducing a width, the droplet can be charged and applied even with respect to a groove having a minute width which would be difficult to charge in a dot shape.

On the other hand, a device of an exemplary embodiment of the present invention is manufactured by applying a droplet on a surface of a substrate. The droplet is applied by the above-mentioned droplet applying method.

Furthermore, electronic equipment of an exemplary embodiment of the present invention includes the above-mentioned device.

Thereby, in an exemplary embodiment of the present invention, a high quality device in which a substantially uniform film with less irregularity is formed and a pattern is formed with a minute line width can be obtained, and high quality electronic equipment causing no or substantially no disconnection or the like can be obtained.

In addition, a droplet applying device of an exemplary embodiment of the present invention discharges a droplet from a droplet discharging head to apply on a substrate surface. The droplet discharging head is arranged in an inclined state with respect to a direction perpendicular to the substrate surface so as to discharge the droplet in a direction intersecting the direction perpendicular to the substrate surface.

Thereby, in an exemplary embodiment of the present invention, the discharged droplet has a velocity component in the direction along the substrate surface. As a result, the each droplet landing on the substrate surface does not spread in a dot shape, but spreads linearly elongated by its kinetic momentum, so that a substantially uniform film with less irregularity can be formed. In this case, since the droplet is formed linearly, the occurrence of quality defects, such as disconnection, can be reduced or suppressed. Furthermore, in an exemplary embodiment of the present invention, since the droplet having a constant volume spreads linearly, the width of the line formed of this droplet becomes small, so that a pattern with a minute line width can be formed.

DETAILED DESCRIPTION OF PREFERRED EMBODIMENTS

Exemplary embodiments of a droplet applying method and a droplet applying device, and a device and electronic equipment of the present invention are described referring to FIGS. 1–11C.

(First Exemplary Embodiment)

Firstly, a droplet applying device is described.

Figure 1A:
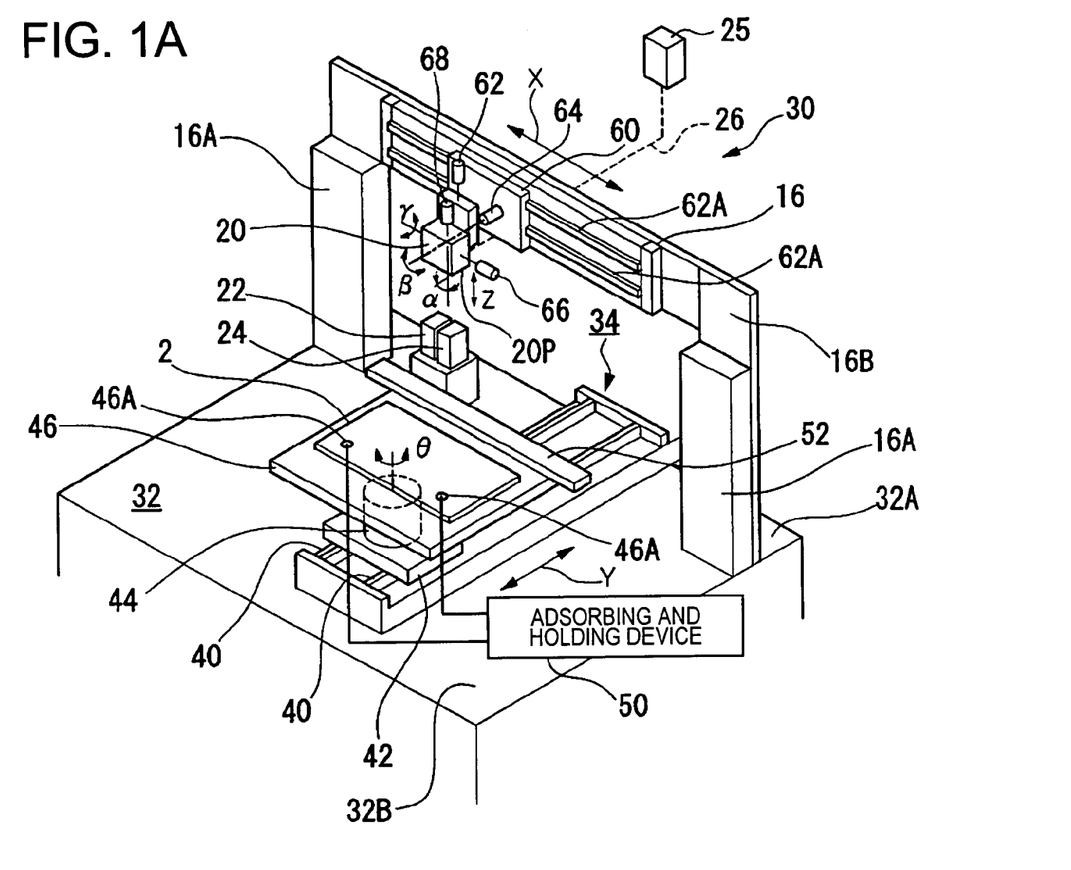
FIG. 1 is a schematic perspective view of a droplet applying device according to an exemplary aspect of the present invention.

FIG. 1 is a schematic exterior perspective view of a droplet applying device 30.

The droplet applying device 30 has a base 32, a first moving device 34, a second moving device 16, electronic balance (a weight measuring device) not shown in the figure, a droplet discharging head 20, a capping unit 22, and a cleaning unit 24 or the like. The first moving device 34, the electronic balance, the capping unit 22, the cleaning unit 24 and the second moving device 16 are set up on the base 32, respectively.

The first moving device 34 is preferably set up directly on the base 32, and this first moving device 34 is positioned along a Y axial direction. In contrast, the second moving device 16 is mounted upright with respect to the base 32 using supporting columns 16A and 16A, and the second moving device 16 is mounted to a rear part 32A of the base 32. An X axial direction of the second moving device 16 is a direction perpendicular to the Y axial direction of the first moving device 34. A Y axis is an axis along a direction of a front part 32B and the rear part 32A of the base 32. In contrast, an X axis is an axis along a lateral direction of the base 32. Both of the directions are horizontal.

The first moving device 34 has guide rails 40 and 40, and as the first moving device 34, for example, a linear motor can be employed. A slider 42 of the first moving device 34 in this linear motor form can be moved along the guide rails 40 in the Y axial direction to be positioned. A table 46 is intended to position and hold a substrate 2 as a work. Furthermore, the table 46 has an adsorbing and holding device 50, and by actuating the adsorbing and holding device 50, the substrate 2 can be adsorbed through hole 46A of the table 46 to be held on the table 46. In the table 46, a preliminary discharging area 52 to waste discharge or trial discharge ink (preliminary discharge) by the droplet discharging head 20 is provided.

The second moving device 16 has a column 16B fixed to the supporting columns 16A and 16A, and in this column 16B, the second moving device 16 in linear motor form is provided. A slider 60 can be moved along guide rails 62A in the X axial direction to be positioned, and in the slider 60, the droplet discharging head 20 as an ink discharging device is provided.

The slider 42 includes a motor 44 for θ axis. This motor 44 is a direct drive motor, for example, and a rotor of the motor 44 is fixed to the table 46. Thereby, by energizing the motor 44, the rotor and the table 46 can be rotated along a θ direction to index (rotation index) the table 46.

The droplet discharging head 20 has motors 62, 64, 66 and 68 for oscillation positioning. The actuation of the motor 62 allows the droplet discharging head 20 to be moved up and down along a Z axis so as to be positioned. This Z axis is a direction (vertical direction) perpendicular to the X axis and the Y axis, respectively. The actuation of the motor 64 allows the droplet discharging head 20 to oscillate along a β direction around the Y axis so as to be positioned. The actuation of a motor 66 allows the droplet discharging head 20 to oscillate in a γ direction around the X axis so as to be positioned. The actuation of the motor 68 allows the droplet discharging head 20 to oscillate in a α direction around the Z axis so as to be positioned.

In this manner, the droplet discharging head 20 in FIG. 1 can be linearly moved in the X axial direction via the slider 60 so as to be positioned, and can be oscillated along the α, β, γ so as to be positioned. An ink discharging surface 20P of the droplet discharging head 20 can control the exact position or posture with respect to the substrate 2 on the table 46 side. In the ink discharging surface 20P of the droplet discharging head 20, there are provided a plurality of nozzles (for example, 120 nozzles) as discharging parts, each discharging ink.

Figure 2A:
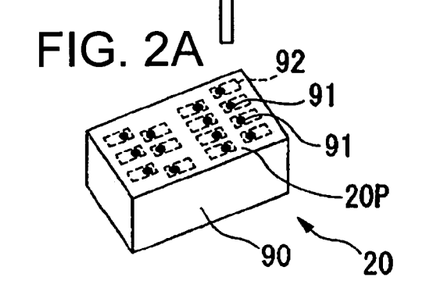
FIGS. 2A–2F are schematics explaining a discharging principle of a liquid substance by a piezo method.
Figure 2B:
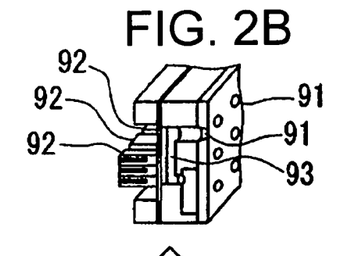
Figure 2C:
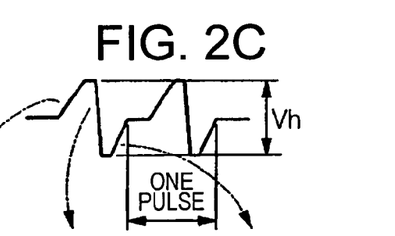
Figure 2D:
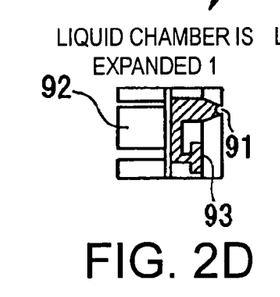
Figure 2E:
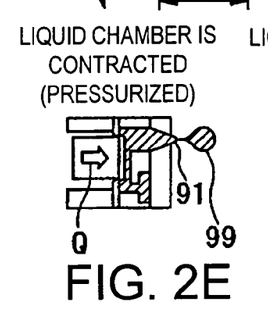
Figure 2F:
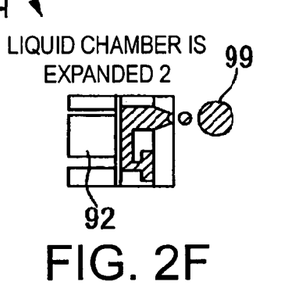

Here, a structural example of the droplet discharging head 20 is described referring to FIGS. 2A–2F. The droplet discharging head 20 uses piezo actuators (piezoelectric actuators), for example, and as shown in FIG. 2A, in the ink discharging surface 20P of a head body 90, a plurality of nozzles (discharging parts) 91 are formed. A piezo actuator 92 is provided for each of these nozzles 91. As shown in FIG. 2B, the piezo actuator 92 is arranged corresponding to the nozzle 91 and an ink chamber 93, and is structured to be located between a pair of electrodes (not shown), for example, and to be bent in such a manner as to be projected outward by energizing. By impressing an applied voltage Vh to this piezo actuator 92 as shown in FIG. 2C, the piezo actuator 92 is expanded and contracted in an arrow Q direction to thereby pressurize the ink and allow a predetermined amount of droplet (ink droplet) 99 to be discharged from the nozzle 91, as shown in FIGS. 2D, 2E and 2F. The drive of such a piezo actuator 92, that is, the droplet discharge from the droplet discharging head 20 is controlled by a control device 25 (refer to FIG. 1).

Back to FIG. 1, the electronic balance receives 5000 ink droplets, for example, from the nozzle of the droplet discharging head 20 in order to measure and manage a weight of one droplet discharged from the nozzle of the droplet discharging head 20. The electronic balance divides the weight of the 5000 droplets by 5000, thereby measuring the weight of one droplet substantially precisely. Based on this measured amount of the droplet, the amount of the droplets discharged from the droplet discharging head 20 can be controlled optimally or on an enhanced basis.

Subsequently, the substrate 2 on which the droplets are applied by the above-mentioned droplet applying device 30 is described.

As a substrate, various types of substrates, such as glass, quartz glass, an Si wafer, a plastic film, and a metal plate can be used, for example. Furthermore, the substrate also includes the cases in which, on the surface of the substrate made of these various materials, a semiconductor film, a metal film, a dielectric film, an organic film, or the like, is formed as a base layer.

Furthermore, a lyophilic treatment is applied to the surface of the substrate 2 so that the surface has lyophilic with respect to the droplets. As the lyophilic treatment, an ultraviolet ray (UV) irradiation treatment imparting lyophilic by irradiating ultraviolet rays, $O_2$ plasma treatment using oxygen as a treatment gas in the air atmosphere, or the like can be selected.

For example, the $O_2$ plasma treatment is performed by irradiating the substrate 2 with oxygen in a plasma state from a plasma discharge electrode. As conditions of the $O_2$ plasma treatment, for example, a plasma power is 50 through 1000 W, an oxygen gas flow volume is 50 through 100 ml/min, a substrate transportation velocity of the substrate 2 with respect to the plasma discharge electrode is 0.5 through 10 mm/sec, and a substrate temperature is 70 through 90° C. In the case where the substrate 2 is a glass substrate, its surface has lyophilic with respect to the droplets, and the application of the $O_2$ plasma treatment and the ultraviolet rays irradiation treatment can increase the lyophilic of the substrate surface.

In order to adjust a contact angle of the substrate surface with respect to the droplet (for example, 10° or less) by this lyophilic treatment, the treatment conditions of the ultraviolet rays irradiation time, plasma treatment time or the like may be adjusted as necessary.

By applying these lyophilic treatments, an organic substance or the like remaining on the substrate surface can be removed.

Subsequently, a process of applying the droplets to the substrate 2 by the above-mentioned droplet applying device 30 is described.

When the substrate 2 to which the above-mentioned lyophilic treatment is applied is fed on the table 46 of the first moving device 34 from a front end side of the table 46, this substrate 2 is adsorbed and held to be positioned with respect to the table 46. Then, the motor 44 is actuated to make setting so that end surfaces of the substrate 2 are parallel to the Y axial direction.

Next, the substrate 2 is moved in the Y axial direction by the first moving device 34 as necessary to be positioned and the droplet discharging head 20 is moved in the X axial direction by the second moving device 16 as necessary to be positioned. Then, after preliminary discharging the droplets from all the nozzles to the preliminary discharging area 52, the droplet discharging head 20 moves to a discharging start position with respect to the substrate 2.

Figure 3:
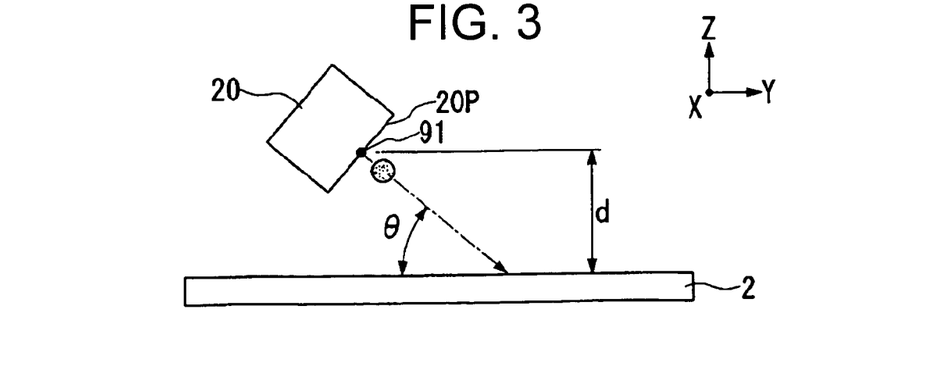
FIG. 3 is a schematic in which a droplet discharging head is arranged so as to be inclined with respect to a substrate surface.

Here, the control device 25 rotates the droplet discharging head 20 around an axis parallel to the X axis via the motor 66, and as shown in FIG. 3, the nozzle surface 20P and the surface of the substrate 2 are not made parallel to each other but intersect with each other. In other words, a direction in which the droplet is discharged from the droplet discharging head 20 intersects with a direction perpendicular to the surface of the substrate 2 (a Z direction) (here, the head 20 is inclined so that the droplet has a velocity component in a +Y direction).

In the present exemplary embodiment, as shown in FIG. 3, a discharging angle θ with respect to the substrate surface is set to 30°.

More specifically, the droplet discharging head 20 is rotated around the X axis to be inclined so that the droplet is discharged to the rear side in a relative movement direction of the substrate 2 during discharging process (on the front side in a relative movement direction of the droplet discharging head 20 with respect to the substrate 2; on the right side in FIG. 3).

Then, the droplet discharging head 20 and the substrate 2 are relatively moved on a predetermined track in the Y axial direction (actually, the substrate 2 moves in a −Y direction with respect to the droplet discharging head 20), and the droplet is discharged to a predetermined region (predetermined positions) on the substrate 2 surface from the nozzle 91.

Figure 4:
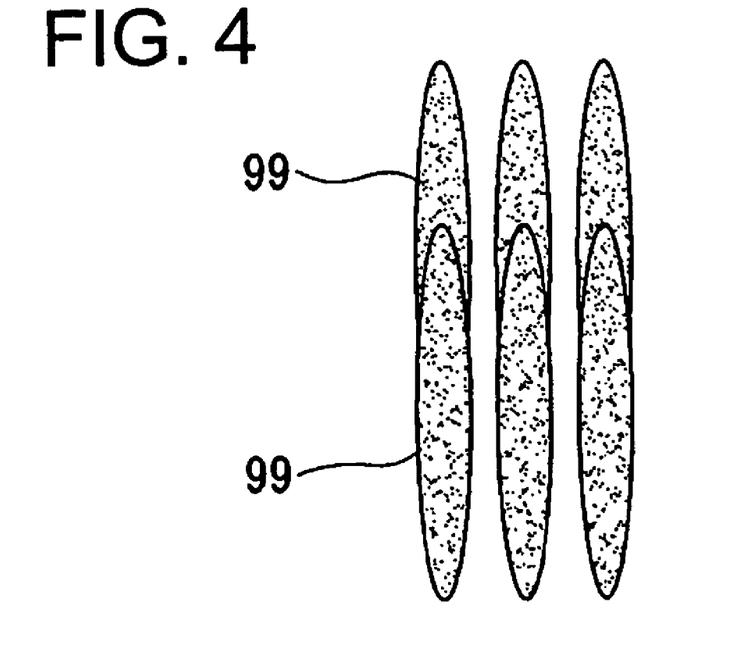
FIG. 4 is a schematic in which droplets are applied linearly on the substrate surface.
Figure 5:
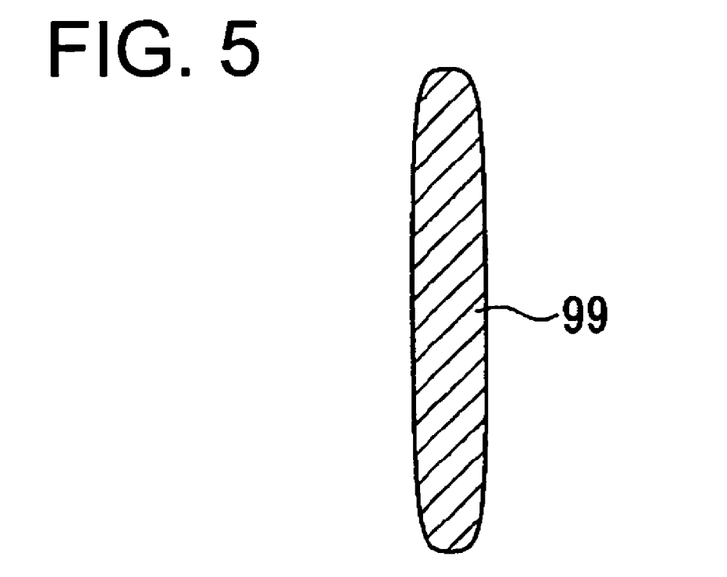
FIG. 5 is a schematic in which a droplet is applied linearly on the substrate surface.

Since the droplet discharged from the droplet discharging head 20 has a velocity component (kinetic momentum) in the direction along the substrate surface (the Y axial direction), and the substrate surface is lyophilic and thus the droplet does not slip, the droplet is not formed in a dot shape when landing on the substrate surface, but as shown in FIG. 4, the droplet spreads linearly with an elongated trail in the relative movement direction (FIG. 4 shows the state in which the two droplets 99 spreading linearly in the Y axial direction are overlapped, and applied two-dimensionally in three rows with a space in the X axial direction, and FIG. 5 shows the state in which as a pattern such as metal wiring, the droplet 99 is applied in a spread state. In this case, since the droplets spread linearly, bonding between the droplets is enhanced, thereby forming a substantially uniform film with less irregularity (film pattern). Furthermore, since the length of the droplet is larger than the case where the droplet lands in a dot shape, the film is formed linearly in the state in which a width thereof is made thin.

At this time, in the case where an initial velocity of the droplet discharged from the nozzle 91 is low, the discharged droplet may curve during flight, thereby reducing a landing position precision. On the contrary, in the case where the initial velocity is high, the droplet landing on the substrate 2 spatters, which may cause problems with an applying position precision and an application amount of the droplet. Therefore, in order not to cause these problems, if a weight of the droplet is defined as W [ng], the initial velocity of the discharged droplet is defined as v [m/s], and a distance between the nozzle 91 of the droplet discharging head 20 and the substrate 2 is defined as d [mm], the droplet may be discharged under conditions satisfying the following formula.

$$40 < (v \cdot W \cdot \sin \theta)/d < 270 \quad (1)$$

Specifically, if $(v \cdot W \cdot \sin \theta)/d$ is 40 or less, flight curve may occur to such an extent as to decrease the landing position precision, and if $(v \cdot W \cdot \sin \theta)/d$ is 270 or more, the droplet landing on the substrate 2 can spatter, but by discharging the droplet under conditions (v, W, $\theta$ and d) satisfying the formula (1), the above-mentioned problem can be addressed or avoided.

In order to adjust the length when the droplet spreads linearly, the values of the above-mentioned v, W, $\theta$ and d only need to be adjusted as necessary, and in order to make the adjustment easy, it is preferable that $\theta$ and d requiring the position adjustment of the droplet discharging head 20 and the substrate 2 are fixed, and that an impressed voltage and a drive waveform to the piezo actuator 92 are adjusted to thereby change the values of v and W. That is, it is preferable for the length adjustment of the pattern to set the values of v and W based on the length of the pattern to be formed.

When one relative movement of the droplet discharging head 20 and the substrate 2 is finished, the droplet discharging head 20 moves stepwise in a predetermined amount in the X axial direction with respect to the substrate 2, and thereafter, discharges the droplets while the substrate 2 moves on another track with respect to the droplet discharging head 20. Then, this operation is repeated several times, so that the droplets can be discharged to the whole droplet applied region to form a thin film.

(Exemplary Embodiment)

When the droplet was discharged under conditions of $((v \cdot W \cdot \sin \theta)/d=60)$ where v=12 m/s, W=10 ng, $\theta=30°$, and d=1 mm, the droplet landing on the substrate 2 was applied at a predetermined position linearly as shown in FIG. 4 without spattering, thereby forming a substantially uniform film with less irregularity.

Similarly, when the droplet was discharged under conditions of $((v \cdot W \cdot \sin \theta)/d=200)$ where v=12 m/s, W=10 ng, $\theta=30°$, d=0.3 mm, a film was obtained with a substantially uniform profile with less irregularity.

In this manner, in the present exemplary embodiment, since the droplet is discharged in a direction intersecting with the Z direction so that the droplet discharged from the droplet discharging head 20 has a velocity component in a direction along the substrate surface, the droplet landing on the substrate 2 can spread linearly to form a film with less irregularity, and in an element having this film, adverse effects on element properties due to the irregularity can be prevented from exerting. Furthermore, in the present exemplary embodiment, the linear spread of the droplet reduces the line width, and a pattern with a more minute line width can be formed in comparison with the case where the droplet lands in a dot shape.

Furthermore, in the present exemplary embodiment, since the droplet is discharged under conditions satisfying the formula (1), a deterioration in the applying position precision due to flight curve of the droplet and fluctuation in application amount due to spattering of the droplet, or the like can be reduced or prevented, and a substrate to which the droplet is applied with a high precision to form a pattern can be obtained. Furthermore, in the present embodiment, by making the applied region of the substrate 2 lyophilic, the landing droplet does not slip, so that a linear pattern can be formed.

In the above-mentioned exemplary embodiment, an example of the case where the droplet is applied in a flat surface part of the substrate surface is used and described, but the present invention is not limited to this. For example, when applying and charging the droplet inside of a groove part formed on the substrate surface, the present invention can be applied. In particular, in the case where a groove width is narrower than a diameter of the droplet, it may be difficult to spread wet the droplet landing in a dot shape inside of the groove part due to surface tension of the droplet. In such a case, by applying the present invention and discharging the droplet with a velocity component in an extending direction of the groove part, the droplet landing in the groove part spreads linearly and reduces the width, so that the droplet can be easily charged and applied even with respect to the groove part with a small width.

(Second Exemplary Embodiment)

Next, a liquid crystal display device is described as a device manufactured by applying droplets according to the above-mentioned droplet applying method.

Figure 6:
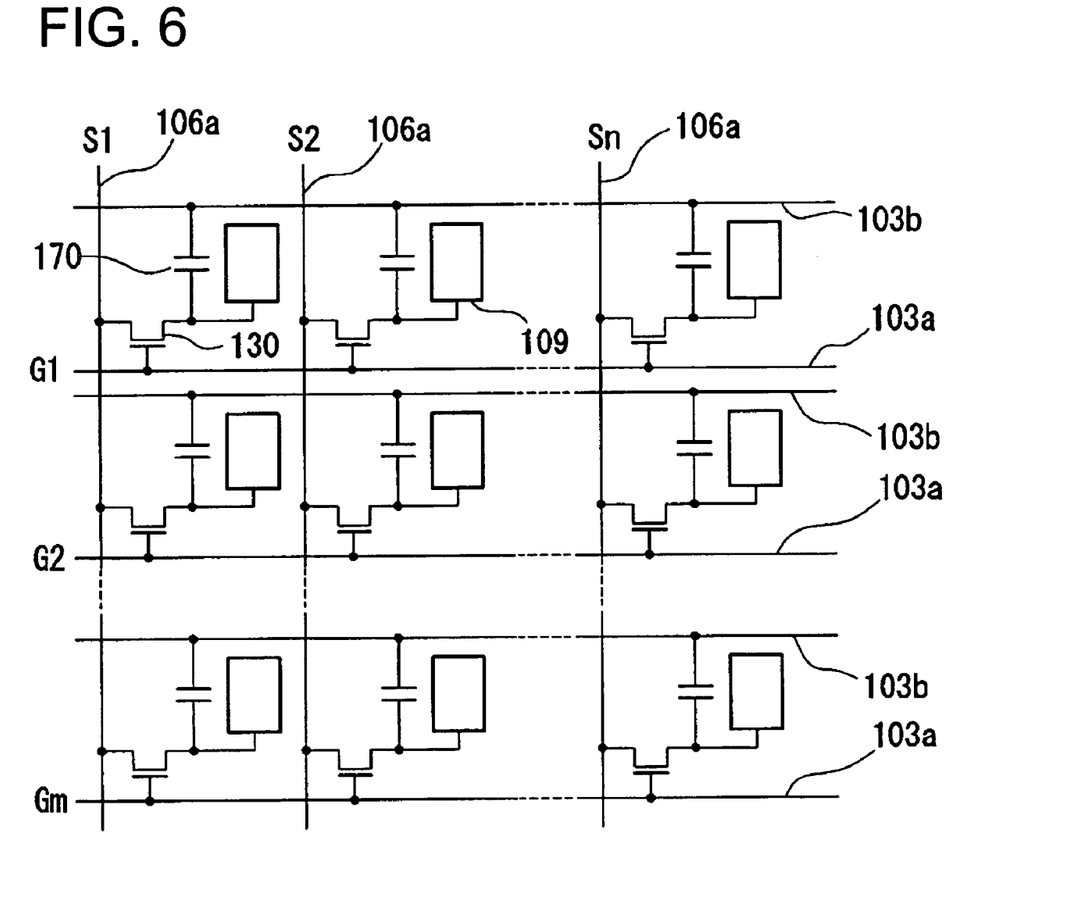
FIG. 6 is a schematic circuit diagram of switching elements, signal lines or the like to which exemplary embodiments of the present invention are applied.
Figure 7:
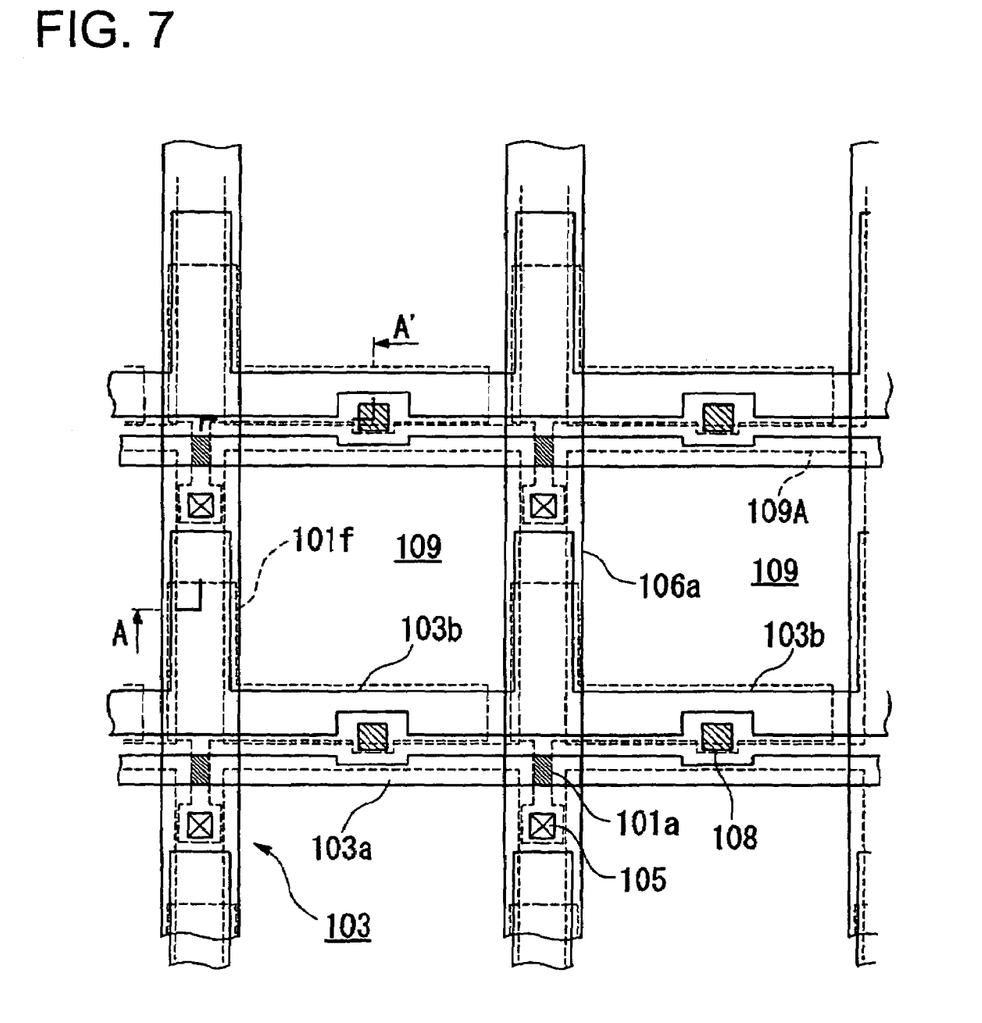
FIG. 7 is a plan view showing a structure of a TFT array substrate to which exemplary embodiments the present invention are applied.
Figure 8:
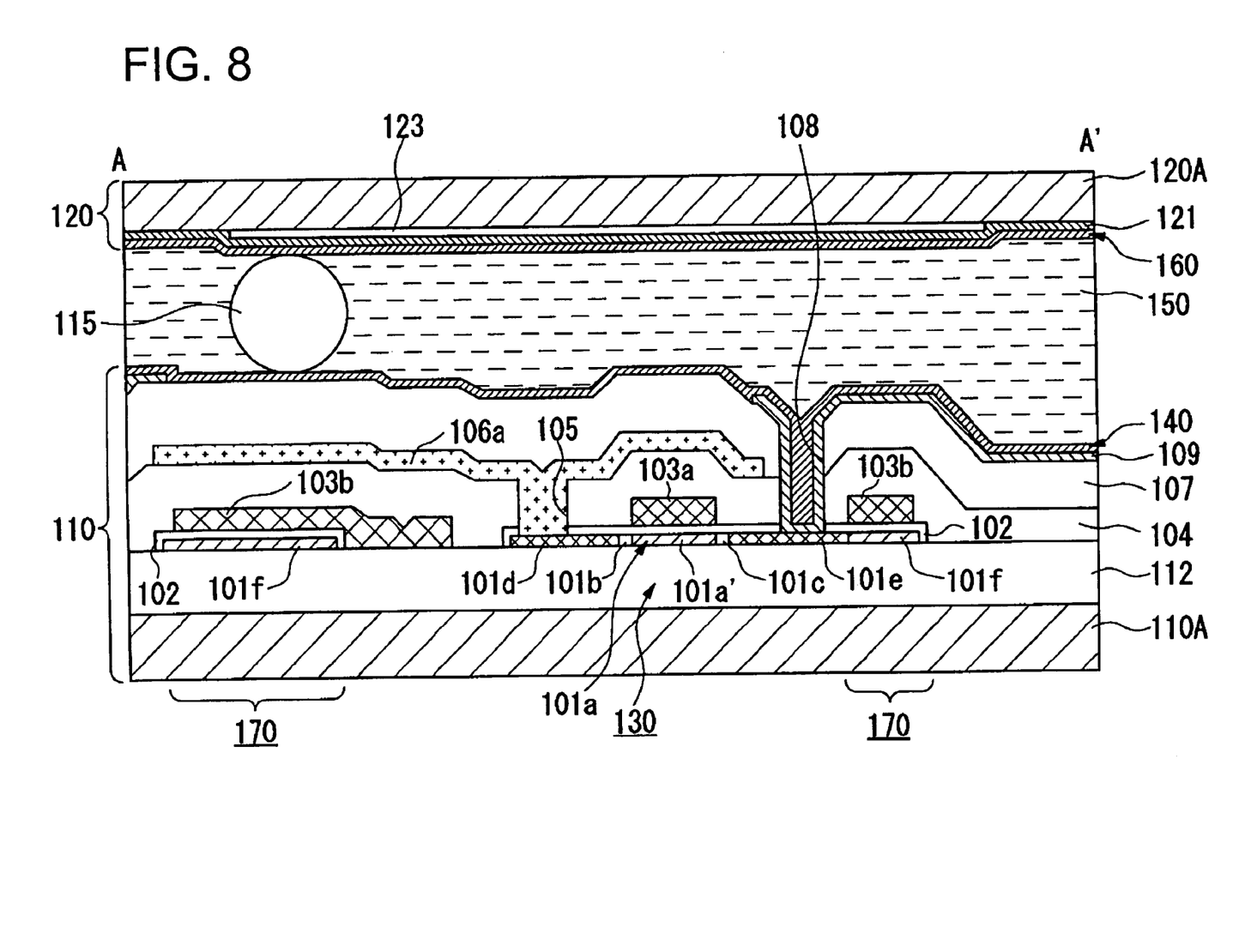
FIG. 8 is a partial cross-sectional view of a liquid crystal display device to which exemplary embodiments of the present invention are applied.

An exemplary embodiment of the present invention can be applied when manufacturing a liquid crystal display device shown in FIGS. 6 through 8. The liquid crystal display device of the present exemplary embodiment is an active matrix type transmissive liquid crystal device using a TFT (Thin Film Transistor) element as a switching element. FIG. 6 is a schematic circuit diagram of switching elements, signal lines or the like in a plurality of pixels arranged in matrix in the transmissive liquid crystal device. FIG. 7 is a partial plan view showing a structure of a plurality of pixel groups adjacent to each other on a TFT array substrate on which data lines, scanning lines, and pixel electrodes or the like are formed. FIG. 8 is a cross-sectional view along plane A–A' in FIG. 7. In FIG. 8, a case where the upper side in the figure is a light incident side, and the lower side in the figure is a viewing side (observer side) is shown. Furthermore, in the respective figures, since respective layers and members are shown in sizes recognizable in the drawings, scales are varied in the respective layers and members.

In the liquid crystal display device of the present exemplary embodiment, as shown in FIG. 6, in the plurality of pixels arranged in matrix, there are formed a pixel electrode 109 and a TFT element 130 which is a switching element to control energizing to the pixel electrode 109, respectively, and a data line 106a to which an image signal is supplied is electrically coupled to a source of the TFT element 130. Image signals S1, S2 . . . Sn to be written in the data lines 106a are sequentially supplied in this order, or are supplied by group with respect to the plurality of data lines 106a adjacent to each other. Furthermore, a scanning line 103a is electrically coupled to a gate of the TFT element 130, and scanning signals G1, G2 . . . Gm are pulsatively impressed at predetermined timing to the plurality of scanning lines 103a in the line order. Furthermore, a pixel electrode 109 is electrically coupled to a drain of the TFT element 130, and by turning on the TFT element 130 which is a switching element, only for a predetermined period, the image signals S1, S2 . . . Sn supplied from the data lines 106a are written at predetermined timing. The image signals S1, S2 . . . Sn at a predetermined level written in the liquid crystal via the pixel electrodes 109 are held between a common electrode described below for a predetermined period. The liquid crystal modulates light by varying the orientation and order of molecular association depending on impressed voltage level, thereby enabling gray scale display. Here, in order to reduce or prevent the held image signals from leaking, a storage capacitance 170 is added in parallel to a liquid crystal capacitance formed between the pixel electrode 109 and the common electrode.

Next, referring to FIG. 7, a planar structure of a substantial part of the liquid crystal display device of the present exemplary embodiment is described. As shown in FIG. 7, on the TFT array substrate, the plurality of rectangular pixel electrodes 109 (the outlines are shown by broken line parts 109A) made of a transparent conductive material, such as Indium Tin Oxide (hereinafter ITO) are provided in matrix, and the data lines 106a, the scanning lines 103a and capacitance lines 103b are provided along the vertical and horizontal borders of the pixel electrodes 109, respectively. Each of the pixel electrodes 109 is electrically coupled to the TFT element 130 provided corresponding to each intersecting part of the scanning line 103a and the data line 106a, and this structure allows the display for each pixel. The data line 106a is electrically coupled via a contact hole 105 to a source region described below in a semiconductor layer 101a made of a polysilicon film, for example, which composes the TFT element 130, and the pixel electrode 109 is electrically coupled via a contact hole 108 to a drain region described below in the semiconductor layer 101a. Furthermore, the scanning line 103a is arranged so as to be opposed to a channel region (a region indicated by oblique lines inclined upward as going to the left in the figure) described below in the semiconductor layer 101a, and the scanning line 103a functions as a gate electrode at the part opposing the channel region. The capacitance line 103b has a main line part extending substantially linearly along the scanning line 103a (that is, as viewed planarly, a first region formed along the scanning line 103a), and a projected part which is projected on a preceding stage side (upward in the figure) along the data line 106a from a portion intersecting with the data line 106a (that is, as viewed planarly, a second region provided extensively along the data line 106a).

Next, referring to FIG. 8, a cross-sectional structure of the liquid crystal display device of the present exemplary embodiment is described.

FIG. 8, as described above, is a cross-sectional view along plane A–A' in FIG. 7, showing a structure of a region where the TFT element 130 is formed. In the liquid crystal display device of the present exemplary embodiment, a liquid crystal layer 150 is interposed between a TFT array substrate 110 and a counter substrate 120 arranged in opposition to this. The TFT array substrate 110 is mainly composed of a translucent substrate body 110A, the TFT element 130 formed on a surface of the substrate body on the liquid crystal layer 150 side, the pixel electrode 109, and an orientation film 140, and the counter substrate 120 is mainly composed of a translucent plastic substrate 120A, a common electrode 121 formed on a surface of the plastic substrate on the liquid crystal layer 150 side, and an orientation film 160. The respective substrates 110 and 120 are held at a predetermined substrate interval (gap) via a spacer 115. In the TFT array substrate 110, the pixel electrode 109 is provided on a surface of the substrate body 110A on the liquid crystal layer 150 side, and at a position adjacent to each of the pixel electrode 109, the TFT element 130 for pixel switching which performs switching control over each of the pixel electrode 109 is provided. The TFT element 130 for pixel switching has an LDD (Lightly Doped Drain) structure, and the scanning line 103a, a channel region 101a' of the semiconductor layer 101a where a channel is formed by electric field from the scanning line 103a, a gate insulating film 102 insulating the scanning line 103a and the semiconductor layer 101a, the data line 106a, a low concentration source region 101b and a low concentration drain region 101c of the semiconductor layer 101a, and a high concentration source region 101d and a high concentration drain region 101e of the semiconductor layer 101a. On the substrate body 110A including surfaces of the scanning line 103a and the gate insulating film 102, there is formed a second interlayer insulating film 104 where the contact hole 105 coupled to the high concentration source region 101d and the contact hole 108 coupled to the high concentration drain region 101e are opened. In other words, the data line 106a is electrically coupled to the high concentration source region 101d via the contact hole 105 penetrating the second interlayer insulating film 104. Furthermore, on the data line 106a and the second interlayer insulating film 104, there is formed a third interlayer insulating film 107 where the contact hole 108 coupled to the high concentration drain region 101e is opened. That is, the high concentration drain region 101e is electrically coupled to the pixel electrode 109 via the contact hole 108 penetrating the second interlayer insulating film 104 and the third interlayer insulating film 107.

In the present exemplary embodiment, the gate insulating film 102 is provided extensively from a position opposed to the scanning line 103a and is used as a dielectric film, and the semiconductor film 101a is provided extensively to serve as a first storage capacitance electrode 101f, and further a part of the capacitance line 103b opposed to these serves as a second storage capacitance electrode, thereby composing the storage capacitance 170. Furthermore, between the TFT array substrate 110A and the TFT element 130 for pixel switching, there is formed a first interlayer insulating film 112 to electrically insulate the semiconductor layer 101a, which composes the TFT element 130 for pixel switching, from the TFT array substrate 110A. Furthermore, on a top surface of the TFT array substrate 110 on the liquid crystal layer 150 side, that is, on the pixel electrode 109 and the third interlayer insulating film 107, the orientation film 140 controlling the orientation of liquid crystal molecules in the liquid crystal layer 150 during impressing no voltage is formed. Accordingly, a region including such a TFT element 130 is structured such that in the top surface of the TFT array substrate 110 on the liquid crystal layer 150 side, that is, on the surface interposing the liquid crystal layer 150, a plurality of irregularities or steps are formed. On the other hand, in regard to the counter substrate 120, on the surface of the substrate body 120A on the liquid crystal layer 150 side, in a region opposed to the forming region (non-pixel region) of the data line 106a, the scanning line 103a and the TFT element 130 for pixel switching, there is provided a second light shielding film 123 to reduce or prevent incident light from entering the channel region 101a', the low concentration source region 101b and the low concentration drain region 101c of the semiconductor layer 101a of the TFT element 130 for pixel switching. Furthermore, on the liquid crystal layer 150 side of the substrate body 120A where the second light shielding film 123 is formed, the common electrode 121 made of ITO or the like is formed over substantially all the surface, and on the liquid crystal layer 150 side thereof, the orientation film 160 controlling the orientation of the liquid crystal molecules in the liquid crystal layer 150 during impressing no voltage is formed.

In the present exemplary embodiment, by applying droplets containing metal fine particles using the above-mentioned droplet applying method, the data line 106a, the scanning line 103a composing the gate electrode, the capacitance line 103b, the pixel electrode 109 or the like can be formed, and by applying droplets of a liquid crystal composition, the liquid crystal layer 150 can be formed. Furthermore, by applying droplets containing an orientation film forming material, the orientation films 140 and 160 can be formed.

In the metal wiring formed by the above-mentioned droplet applying method, the line width becomes minute, which can contribute to the miniaturization of the device, and bulge or the like hardly occurs, so that the occurrence of quality defects such as disconnection can be reduced or suppressed.

Furthermore, the liquid crystal layer and the orientation film formed by the above-mentioned droplet applying method are films having less irregularity, and thus occurrence of display unevenness or the like due to film thickness unevenness can be reduced or suppressed, thereby contributing to enhancement in quality.

In particular, when forming the orientation films 140 and 160, by the alignment of the orientation direction and the discharging direction of the droplet, separately providing a rubbing treatment process becomes unnecessary, thereby contributing to improvement in productivity as well.

(Third Exemplary Embodiment)

An exemplary embodiment of the present invention can be used to form a film serving as a component of a color filter.

Figure 9:
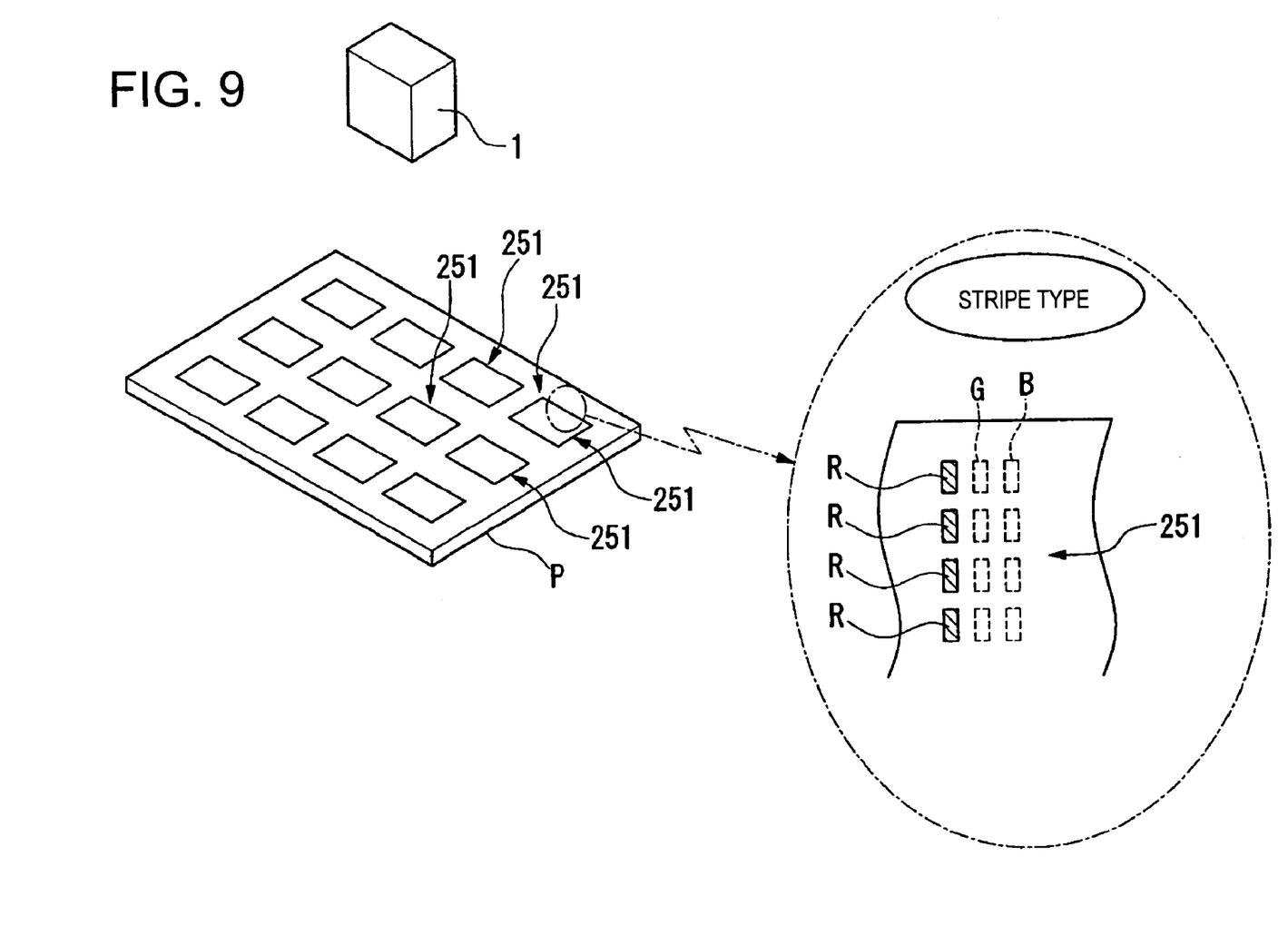
FIG. 9 is an exemplary view of a color filter to which the present invention is applied.

FIG. 9 is a schematic showing the color filters formed on a substrate P. As shown in FIG. 9, in this example, a plurality of color filter regions 251 are formed in matrix on the rectangular substrate P in terms of enhancing productivity. These color filter regions 251 can be used as color filters adapted to the liquid crystal display device by cutting the substrate P later.

The color filter regions 251 are obtained by forming a liquid composition of R (red), a liquid composition of G (green), and a liquid composition of B (blue) in a predetermined pattern, in the present example, in a related art or publicly known conventional striped type pattern.

As this forming pattern, in addition to the stripe type, a mosaic type, a delta type, a square type, or the like, may be employed. The above-mentioned interfacial active agent is added to the respective liquid compositions of R, G, and B.

In the present exemplary embodiment, the liquid compositions of R, G and B are applied to the corresponding color filter regions 251 using the above-mentioned droplet applying method to thereby manufacture the color filters. Thereby, the color filters having a substantially uniform film thickness with less irregularity can be obtained, enabling enhancement in display quality.

Furthermore, in order to planarize the substrate P and protect the color filters, an over coat layer covering these is formed. This over coat layer may be formed using the above-mentioned droplet applying method. In this case as well, since the surface can be planarized, the display quality can be enhanced.

(Fourth Exemplary Embodiment)

Next, as a fourth exemplary embodiment, a plasma type display device is described as one example of the device of the present invention.

Figure 10:
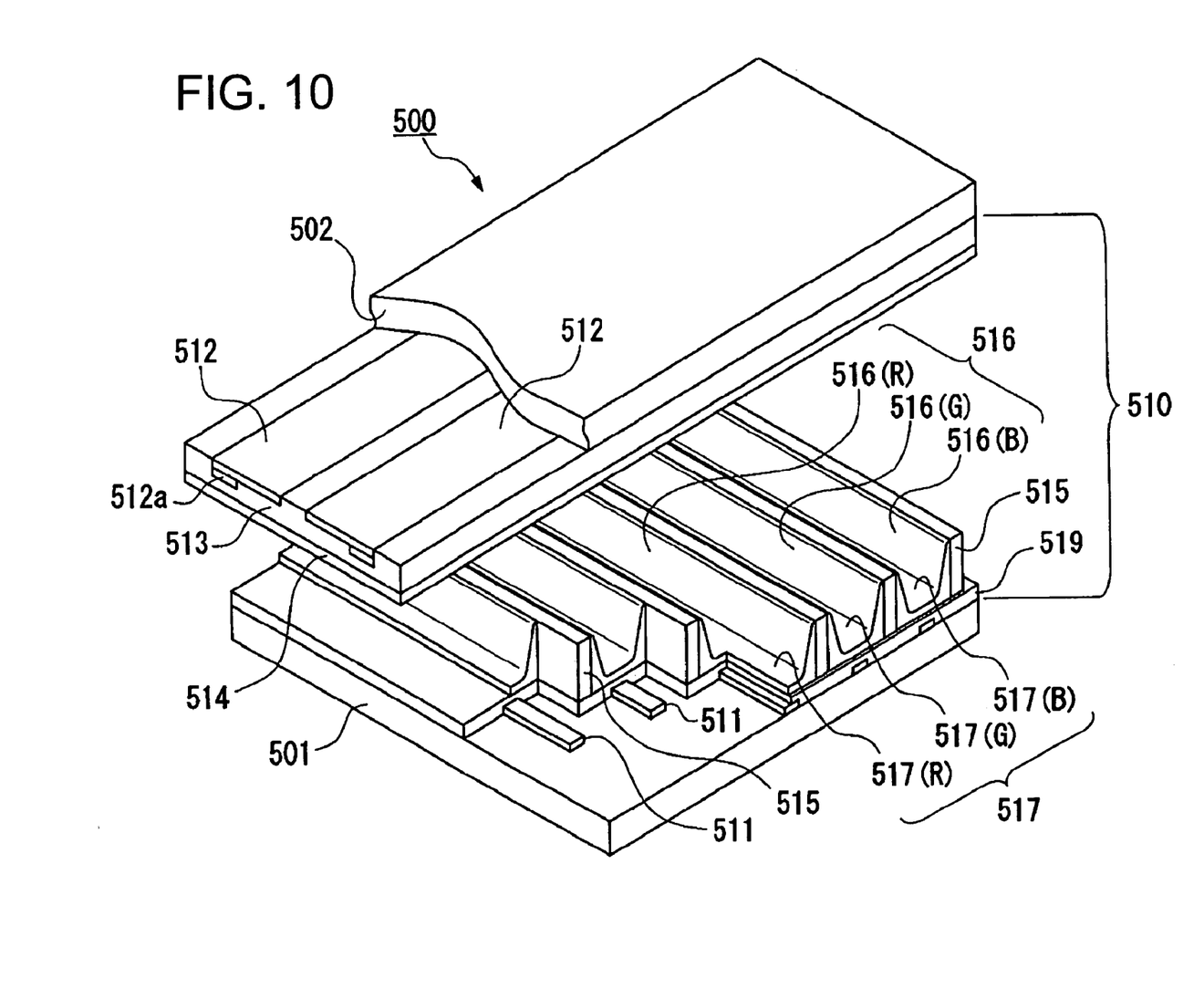
FIG. 10 is an exploded perspective view of a plasma type display device.

FIG. 9 is an exploded perspective view of a plasma type display device 500 of the present exemplary embodiment.

The plasma type display device 500 is structured including substrates 501 and 502 arranged in opposition to each other, and an electric discharging display part 510 formed between the substrates.

The electric discharging display part 510 is constituted by assembling a plurality of electric discharging chambers 516. In the plurality of electric discharging chambers 516, three electric discharging chambers 516 of a red electric discharging chamber 516 (R), a green electric discharging chamber 516 (G) and a blue electric discharging chamber 516 (B) are arranged to make a set and compose one pixel.

On the upper surface of the substrate 501, address electrodes 511 are formed in stripes at predetermined intervals, and a dielectric layer 519 is formed so as to cover the upper surfaces of the address electrodes 511 and the substrate 501.

On the dielectric layer 519, partition walls 515 are formed so as to be located between the address electrodes 511 and 511 and along the respective address electrodes 511. The partition walls 515 include partition walls adjacent to both lateral sides in a width direction of the address electrodes 511, and partition walls provided extensively in a direction perpendicular to the address electrodes 511. Furthermore, the electric discharging chambers 516 are formed corresponding to rectangular regions demarcated by the partition walls 515.

Furthermore, inside of the rectangular regions demarcated by the partition walls 515, fluorescent substances 517 are arranged. The fluorescent substances 517 emits any fluorescence of red, green and blue, and in a bottom part of the red electric discharging chamber 516 (R), a red fluorescent substance 517 (R) is arranged, in a bottom part of the green electric discharging chamber 516 (G), a green fluorescent substance 517 (G) is arranged, and in a bottom part of the blue electric discharging chamber 516 (B), a blue fluorescent substance 517 (B) is arranged, respectively.

On the other hand, on the substrate 502, a plurality of display electrodes 512 are formed in stripes at predetermined intervals in the direction perpendicular to the former address electrodes 511. Furthermore, a dielectric layer 513 and a protective film 514 made of MgO or the like are formed so as to cover these.

The substrate 501 and the substrate 502 are stuck on each other so as to make the address electrodes 511 . . . and the display electrodes 512 . . . opposed perpendicularly to each other.

The above-mentioned address electrodes 511 and the display electrodes 512 are coupled to an AC power source (not shown). By energizing the respective electrodes, the fluorescent substances 517 are excited to emit light in the electric discharge display part 510, thereby enabling color display.

In the present exemplary embodiment, since the above-mentioned address electrodes 511 and the display electrodes 512 are formed based on the above-mentioned droplet applying method, respectively, a high quality plasma type display device which realizes the miniaturization and reduction in thickness and causes no or substantially no defect, such as a short circuit, can be obtained.

Furthermore, an exemplary embodiment of the present invention is not limited to the manufacturing of the above-mentioned color filter for liquid crystal display and the plasma type display device, but as an example of the device, for example, the present invention can be applied to form a metal wiring in an EL (electroluminescence) display device or a semiconductor device.

The EL display device is an element having a structure that a thin film containing fluorescent inorganic and organic compounds is interposed between a negative electrode and a positive electrode, and electrons and holes are injected into the thin film to rebond them, thereby generating excitons, and that light emission (fluorescence/phosphorescence) when these excitons are deactivated is used to emit light. In the fluorescent materials used for such an EL display element, the materials exhibiting luminescent colors of red, green and blue are patterned on an element substrate, such as TFT, using the droplet applying method of an exemplary embodiment of the present invention to thereby manufacture a self-luminous full color EL display device. The scope of the device in the present invention also includes such an EL display device.

Furthermore, the case where a predetermined material is applied on the entire surface of a substrate to form a so-called solid film can be applied to a reflection film, an interlayer insulating film or an over coat layer formed on a circuit substrate, or the like.

(Fifth Exemplary Embodiment)

As a fifth exemplary embodiment, a concrete example of electronic equipment of the present invention is described.

Figure 11A:
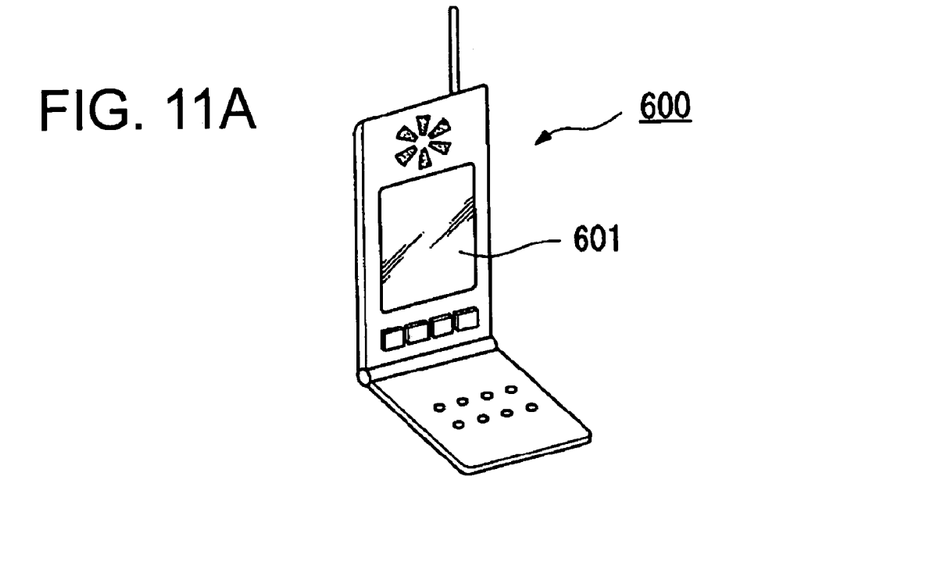
FIGS. 11A–11C are schematics of examples of exemplary embodiments of electronic equipment of the present invention.

FIG. 11A is a perspective view showing an example of a cellular phone. In FIG. 11A, reference numeral 600 denotes a cellular phone body, and reference numeral 601 denotes a liquid crystal display part including the liquid crystal display device of the above-mentioned exemplary embodiment.

Figure 11B:
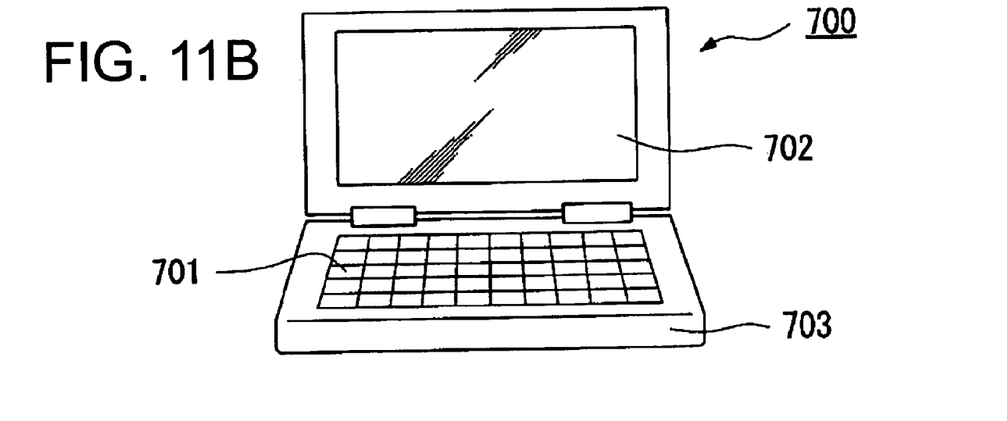

FIG. 11B is a perspective view showing an example of portable information processing device, such as a word processor and a personal computer, for example. In FIG. 11B, reference numeral 700 denotes an information processing device, reference numeral 701 denotes an input part, such as a keyboard, reference numeral 703 denotes an information processing body, and reference numeral 702 denotes the liquid crystal display part including the liquid crystal display device of the above-mentioned exemplary embodiment.

Figure 11C:
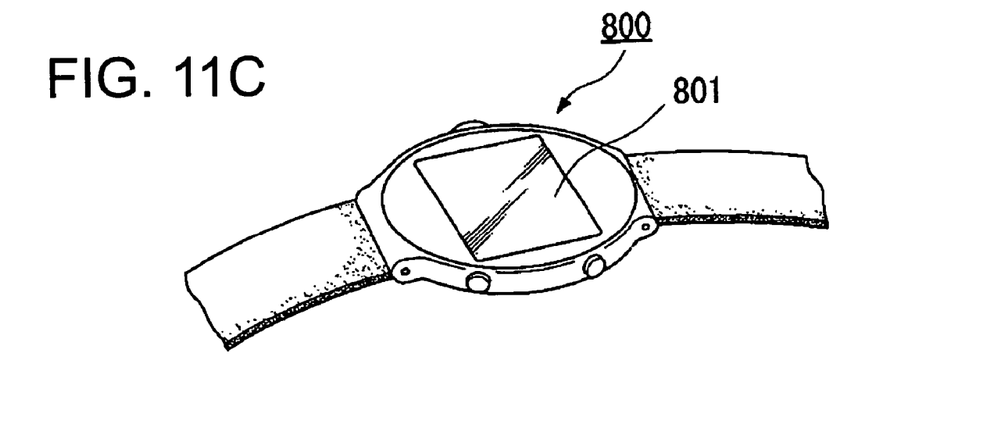

FIG. 11C is a perspective view showing an example of a wrist watch type of electronic equipment. In FIG. 11C, reference numeral 800 denotes a watch body, reference numeral 801 denotes the liquid crystal display part including the liquid crystal display device of the above-mentioned exemplary embodiment.

Since the electronic equipment shown in FIGS. 11A–11C includes the liquid crystal display device of the above-mentioned exemplary embodiment, miniaturization and high quality can be addressed or attained.

Although the electronic equipment of the present exemplary embodiment includes the liquid crystal device, the electro equipment can include another electro-optic device, such as an organic electroluminescence display device and a plasma type display device.

Although as described above, exemplary embodiments according to the present invention are explained referring to the attached drawings, needless to say, the present invention is not limited to these examples. In the above-mentioned examples, the shapes, the combinations or the like of the each described components are exemplary, and various modifications can be made based on design demand or the like within the scope not departing from the gist of the present invention.

For example, in the above-mentioned first exemplary embodiment, the case where the whole substrate surface is made lyophilic is described, but the present invention is not limited to this, and a structure that after the substrate surface has been made liquid-repellent, only a wiring pattern (droplet applied region) is made lyophilic may be employed.

What is claimed is:

1. A droplet applying method, comprising:
    discharging a droplet from a droplet discharging head to apply in a predetermined region on a substrate surface, while relatively moving the droplet discharging head and the substrate, the discharging including:
        discharging the droplet to the substrate surface in a direction intersecting a vertical direction, and
        discharging, when the droplet discharging head and the substrate are relatively moved to discharge the droplet, the droplet along the relative movement direction, each discharged droplet landing on the substrate surface, and being applied linearly with an elongated trail in the relative movement direction.

2. The droplet applying method according to claim 1, when the droplet is discharged with a weight of the droplet defined as W [ng], an initial velocity of the discharged droplet defined as v [m/s], a distance between a discharging part of the droplet discharging head that discharges the droplet and the substrate defined as d [mm], and an angle with respect to the substrate surface defined as θ, the following condition being satisfied:

$$40 < (v \cdot W \cdot \sin\theta)/d < 270.$$

3. The droplet applying method according to claim 1, the predetermined region of the substrate surface being lyophilic with respect to the droplet.

4. The droplet applying method according to claim 1, further including discharging the droplet to a groove part formed in the substrate.

* * * * *